(12) United States Patent
Shiah et al.

(10) Patent No.: US 8,755,236 B2
(45) Date of Patent: Jun. 17, 2014

(54) LATCH SYSTEM APPLIED TO A PLURALITY OF BANKS OF A MEMORY CIRCUIT

(75) Inventors: Chun Shiah, Hsinchu (TW); Shi-Huei Liu, Hsinchu County (TW); Cheng-Nan Chang, Tainan (TW)

(73) Assignee: Etron Technology, Inc., Hsinchu (TW)

( * ) Notice: Subject to any disclaimer, the term of this patent is extended or adjusted under 35 U.S.C. 154(b) by 275 days.

(21) Appl. No.: 13/365,273

(22) Filed: Feb. 3, 2012

(65) Prior Publication Data
US 2012/0230124 A1 Sep. 13, 2012

(30) Foreign Application Priority Data
Mar. 9, 2011 (TW) .............................. 100107885 A

(51) Int. Cl.
*G11C 7/10* (2006.01)

(52) U.S. Cl.
USPC .................. 365/189.05; 365/219; 341/100

(58) Field of Classification Search
USPC .............................. 365/189.05, 219; 341/100
See application file for complete search history.

(56) References Cited

U.S. PATENT DOCUMENTS

| | | | |
|---|---|---|---|
| 6,177,891 B1 * | 1/2001 | Nakamura | 341/100 |
| 6,215,837 B1 * | 4/2001 | Yi | 377/26 |
| 6,606,272 B2 * | 8/2003 | Oh et al. | 365/189.12 |
| 7,515,075 B1 * | 4/2009 | Wallner et al. | 341/100 |
| 7,605,726 B2 * | 10/2009 | Byeon | 341/100 |
| 8,217,814 B1 * | 7/2012 | Hassan | 341/100 |
| 2008/0238512 A1 | 10/2008 | Byeon | |

* cited by examiner

*Primary Examiner* — Vanthu Nguyen
(74) *Attorney, Agent, or Firm* — Winston Hsu; Scott Margo

(57) ABSTRACT

A latch system applied to a plurality of banks of a memory circuit includes a front latch circuit and a plurality of rear latch circuit. The front latch circuit is used for receiving a datum and a front latch enabling signal, and generating and outputting an intermediate signal according to the datum and the front latch enabling signal. Each rear latch circuit of the plurality of rear latch circuits is coupled to an output terminal of the front latch circuit for receiving the intermediate signal, and generating and outputting a rear latch datum to a corresponding bank of the plurality of banks according to the intermediate signal and a corresponding rear latch enabling signal, where only one rear latch enabling signal is enabled at any time.

6 Claims, 5 Drawing Sheets

LATCH SYSTEM APPLIED TO A PLURALITY OF BANKS OF A MEMORY CIRCUIT

BACKGROUND OF THE INVENTION

1. Field of the Invention

The present invention is related to a latch system applied to a plurality of banks of a memory circuit, and particularly to a latch system that includes a front latch circuit and a plurality of rear latch circuits, where the front latch circuit and the plurality of rear latch circuits are not turned on simultaneously.

2. Description of the Prior Art

Please refer to FIG. 1. FIG. 1 is a diagram illustrating a latch system 100 applied to a plurality of banks of a memory circuit according to the prior art. The latch system 100 has a plurality of latch circuits L0 to Ln−1, where each latch circuit corresponds to a bank. For example, a latch circuit L0 corresponds to a bank B0, a latch circuit L1 corresponds to a bank B1, and so on. Each latch circuit has a first input terminal for receiving a datum, a second input terminal for receiving a corresponding latch enabling signal, and an output terminal for outputting a latch datum to a corresponding bank. For example, after the latch circuit L0 receives a datum D and a latch enabling signal LE0, the latch circuit L0 generates and outputs a latch datum LD0 to the bank B0 according to the datum D and the latch enabling signal LE0. As shown in FIG. 1, a transmission gate T00 and a transmission gate T01 of the latch circuit L0 are not turned on and off simultaneously. That is to say, when the transmission gate T00 is turned on, the transmission gate T01 is turned off; and when the transmission gate T00 is turned off, the transmission gate T01 is turned on.

Please refer to FIG. 2. FIG. 2 is a timing diagram illustrating an operation timing of the latch system 100. As shown in FIG. 1 and FIG. 2, at a first interval T1, a transmission gate T00 is turned on and a transmission gate T01 is turned off. Because the transmission gate T00 is turned on, an intermediate signal IS is equal to the datum D. The transmission gate T01 is turned off, so a signal LD0 of an output terminal of the latch circuit L0 is unknown. At a second interval T2, the latch circuit L0 receives a latch enabling signal LE0, so the transmission gate T00 is turned off and the transmission gate T01 is turned on. Because the transmission gate T00 is turned off and the transmission gate T01 is turned on, the intermediate signal IS maintains a value of the intermediate signal IS at the second interval T1, and the signal LD0 of the output terminal of the latch circuit L0 is equal to the intermediate signal IS. At a third interval T3, when the latch enabling signal LE0 changes from a logical-high voltage "1" to a logical-low voltage "0", the transmission gate T00 is turned on and the transmission gate T01 is turned off. Because the transmission gate T00 is turned on, the intermediate signal IS is equal to the datum D. The transmission gate T01 is turned off, so the signal LD0 of the output terminal of the latch circuit L0 maintains a value of the intermediate signal IS at the second interval T2. Further, subsequent operational principles of other latch circuits of the latch system 100 are the same as those of the latch circuit L0, so further description thereof is omitted for simplicity.

Please refer to FIG. 3. FIG. 3 is a diagram illustrating unpredictability of the signal LD0 of the output terminal of the latch circuit L0 when a negative edge of the latch enabling signal LE0 is not sharp enough. As shown in FIG. 3, at the third interval T3, because the latch enabling signal LE0 changes from the logical-high voltage "1" to the logical-low voltage "0" too slowly, the transmission gate T00 and the transmission gate T01 are turned on simultaneously, resulting in the signal LD0 of the output terminal of the latch circuit L0 being equal to the intermediate signal IS at the third interval T3, instead of maintaining the value of the intermediate signal IS at the second interval T2.

To sum up, the latch system 100 utilizes the latch enabling signal LE0 to control the transmission gate T00 and the transmission gate T01 simultaneously, so the signal LD0 of the output terminal of the latch circuit L0 may be unpredictable. Thus, the latch system 100 is not a good choice for a user.

SUMMARY OF THE INVENTION

A latch system applied to a plurality of banks of a memory circuit. The latch system includes a front latch circuit and a plurality of rear latch circuits. The front latch circuit has a first input terminal for receiving a datum, a second input terminal for receiving a front latch enabling signal, and an output terminal for outputting an intermediate signal, where the front latch circuit generates the intermediate signal according to the datum and the front latch enabling signal. Each rear latch circuit of the plurality of rear latch circuits has a first input terminal coupled to the output terminal of the front latch circuit for receiving the intermediate signal, a second input terminal for receiving a corresponding rear latch enabling signal, and an output terminal for outputting a rear latch datum to a corresponding bank, where the rear latch circuit generates the rear latch datum according to the intermediate signal and the corresponding rear latch enabling signal. Number of the plurality of banks is equal to number of the plurality of rear latch circuits, and only one rear latch enabling signal is enabled at any time.

The present invention provides a latch system applied to a plurality of banks of a memory circuit. In the latch system, a first transmission gate is controlled by a front latch enabling signal and a second transmission gate is controlled by a rear latch enabling signal, so the first transmission gate and the second transmission gate are not turned on simultaneously. Therefore, compared to the prior art, a signal of an output terminal of the latch system is not unpredictable. In addition, the latch system only has one front latch circuit, so an area of the latch system is less than an area of a latch system provided by the prior art.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
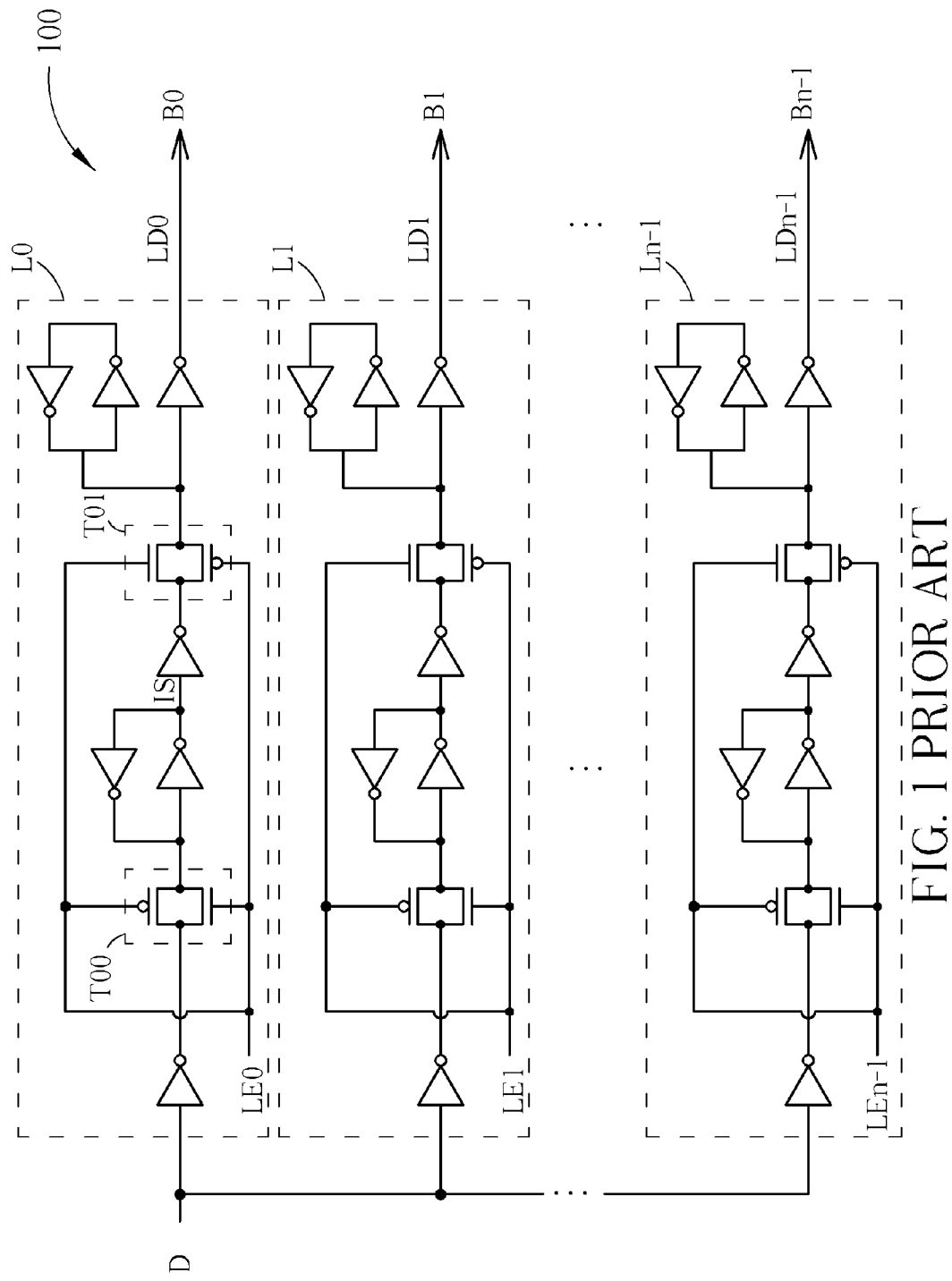
FIG. 1 is a diagram illustrating a latch system applied to a plurality of banks of a memory circuit according to the prior art.
Figure 2:
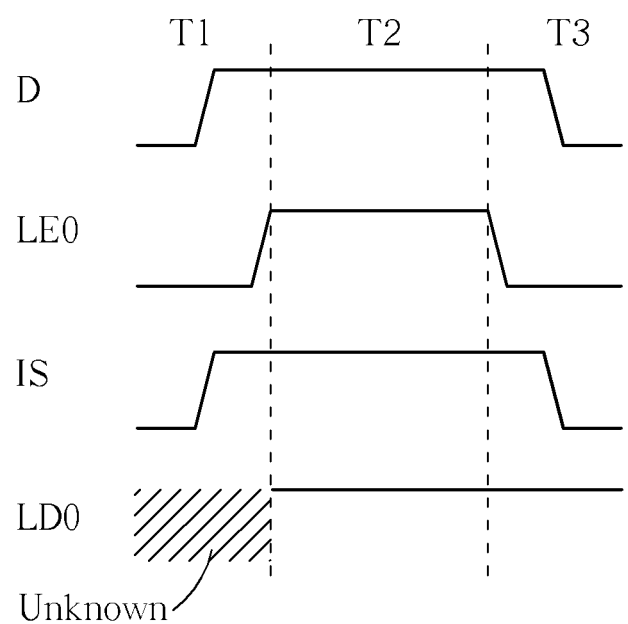
FIG. 2 is a timing diagram illustrating an operation timing of the latch system.
Figure 3:
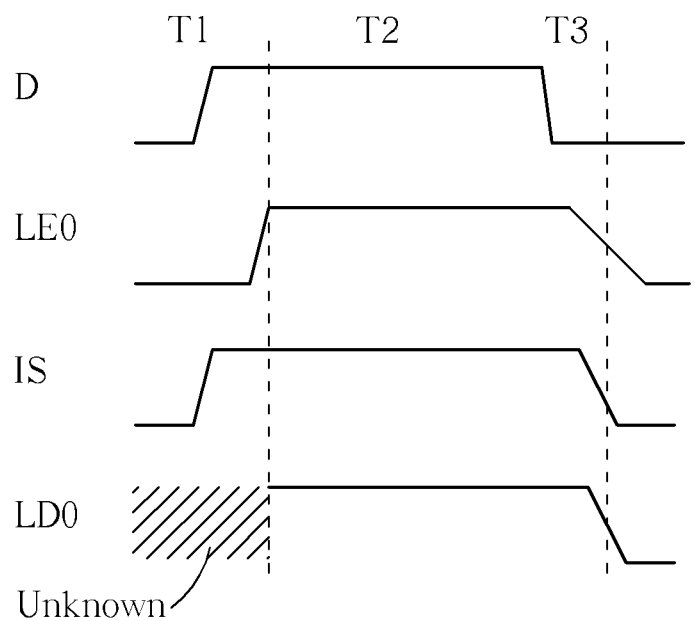
FIG. 3 is a diagram illustrating the signal of the output terminal of the latch circuit is unpredictable when a negative edge of the latch enabling signal LE0 is not sharp enough.
Figure 4:
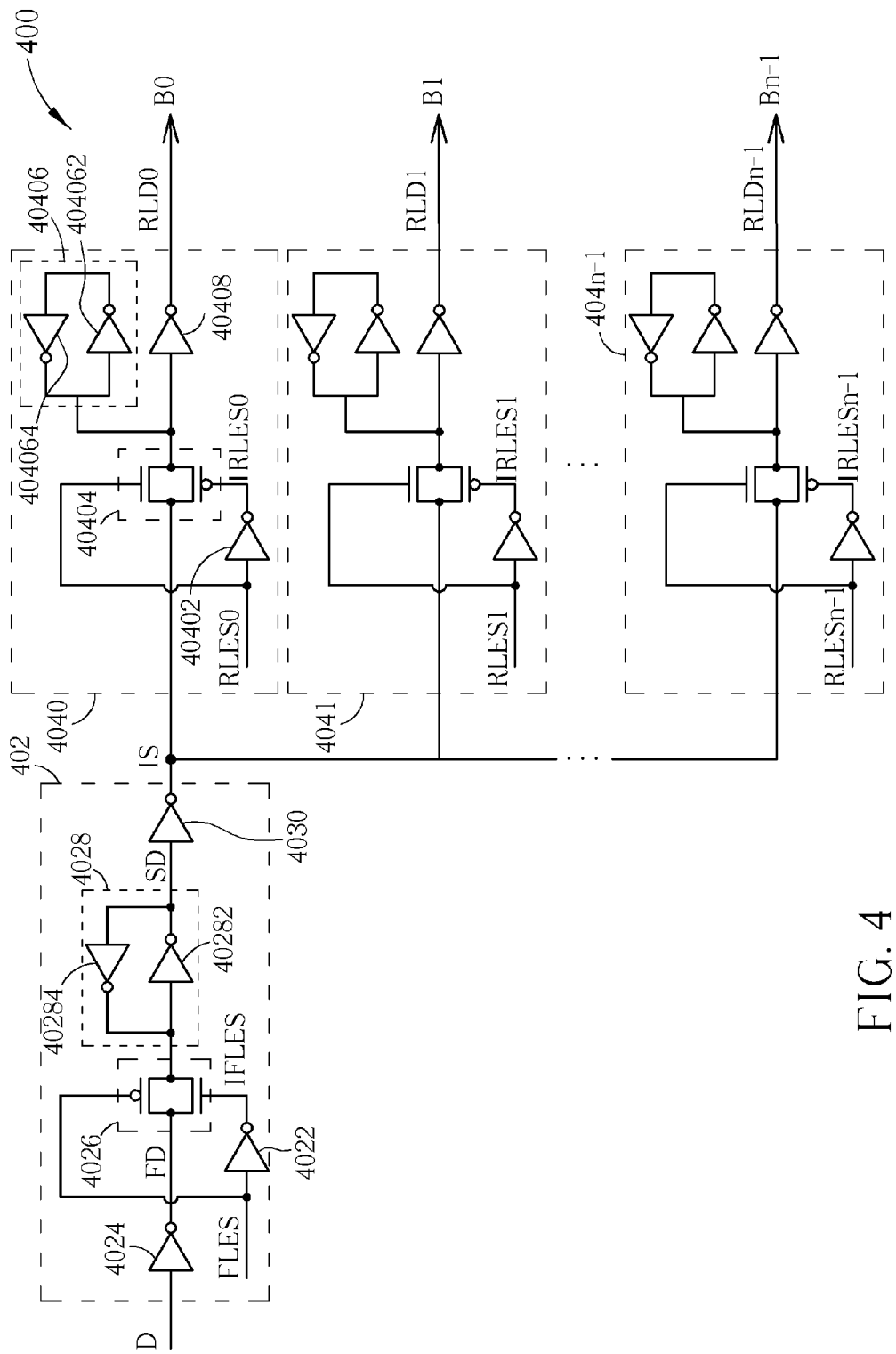
FIG. 4 is a diagram illustrating a latch system applied to a plurality of banks of a memory circuit according to an embodiment.

Please refer to FIG. 4. FIG. 4 is a diagram illustrating a latch system 400 applied to a plurality of banks of a memory circuit according to an embodiment. The latch system 400 includes a front latch circuit 402 and a plurality of rear latch circuits 4040 to 404n–1. The front latch circuit 402 has a first input terminal for receiving a datum D, a second input terminal for receiving a front latch enabling signal FLES, and an output terminal for outputting an intermediate signal IS. The front latch circuit 402 generates the intermediate signal IS according to the datum D and the front latch enabling signal FLES. Each rear latch circuit of the plurality of rear latch circuits 4040-404n–1 has a first input terminal coupled to the output terminal of the front latch circuit 402 for receiving the intermediate signal IS, a second input terminal for receiving a corresponding rear latch enabling signal, and an output terminal for outputting a rear latch datum to a corresponding bank. Each rear latch circuit generates a rear latch datum to a corresponding bank according to the intermediate signal IS and a corresponding rear latch enabling signal. For example, a rear latch circuit 4040 has a first input terminal coupled to the output terminal of the front latch circuit 402 for receiving the intermediate signal IS, a second input terminal for receiving a rear latch enabling signal RLES0, and an output terminal for outputting a rear latch datum RLD0 to a bank B0. The rear latch circuit 4040 generates the rear latch datum RLD0 to the bank B0 according to the intermediate signal IS and the rear latch enabling signal RLES0. In addition, number of the plurality of banks is equal to number of the plurality of rear latch circuits 4040-404n–1, and only one rear latch enabling signal is enabled at any time.

As shown in FIG. 4, the front latch circuit 402 includes a first inverter 4022, a second inverter 4024, a first transmission gate 4026, a first latch unit 4028, and a third inverter 4030. The first inverter 4022 has a first terminal coupled to the second input terminal of the front latch circuit 402, and a second terminal for outputting an inverse front latch enabling signal IFLES, where the first inverter 4022 is used for inverting the front latch enabling signal FLES to generate the inverse front latch enabling signal IFLES. The second inverter 4024 has a first terminal coupled to the first input terminal of the front latch circuit 402, and a second terminal for outputting a first datum FD, where the second inverter 4024 is used for inverting the datum D to generate the first datum FD, and a phase of the first datum FD is opposite to a phase of the datum D. The first transmission gate 4026 has a first terminal coupled to the second terminal of the second inverter 4024 for receiving the first datum FD, a second terminal for receiving the front latch enabling signal FLES, a third terminal for outputting the first datum FD, and a fourth terminal coupled to the second terminal of the first inverter 4022 for receiving the inverse front latch enabling signal IFLES, where the first transmission gate 4026 transmits the first datum FD according to the front latch enabling signal FLES and the inverse front latch enabling signal IFLES. The first latch unit 4028 has a first terminal coupled to the third terminal of the first transmission gate 4026 for receiving the first datum FD, and a second terminal for outputting a second datum SD, where a phase of the second datum SD is the same as the phase of the datum D. The first latch unit 4028 includes a fourth inverter 40282 and a fifth inverter 40284. The fourth inverter 40282 has a first terminal for receiving the first datum FD, and a second terminal for outputting the second datum SD, where the fourth inverter 40282 is used for inverting the first datum FD to generate the second datum SD. The fifth inverter 40284 has a first terminal for receiving the second datum SD, and a second terminal for outputting the first datum FD, where the fifth inverter 40284 is used for inverting the second datum SD to generate the first datum FD. Therefore, the first latch unit 4028 can latch a voltage of the second terminal of the first latch unit 4028 at the second datum SD according to the first datum FD. The third inverter 4030 has a first terminal coupled to the second terminal of the first latch unit 4028 for receiving the second datum SD, and a second terminal coupled to the output terminal of the front latch circuit 402 for outputting the intermediate signal IS, where the third inverter 4030 is used for inverting the second datum SD to generate the intermediate signal IS, and a phase of the intermediate signal IS is opposite to the phase of the datum D.

As shown in FIG. 4, the rear latch circuit 4040 includes a sixth inverter 40402, a second transmission gate 40404, a second latch unit 40406, and a seventh inverter 40408. The sixth inverter 40402 has a first terminal coupled to the second input terminal of the rear latch circuit 4040, and a second terminal for outputting an inverse rear latch enabling signal IRLES0, where the sixth inverter 40402 is used for inverting the rear latch enabling signal RLES0 to generate the inverse rear latch enabling signal IRLES0. The second transmission gate 40404 has a first terminal coupled to the first input terminal of the rear latch circuit 4040 for receiving the intermediate signal IS, a second terminal coupled to the second input terminal of the rear latch circuit 4040 for receiving the rear latch enabling signal RLES0, a third terminal for outputting the intermediate signal IS, and a fourth terminal coupled to the second terminal of the sixth inverter 40402 for receiving the inverse rear latch enabling signal IRLES0, where the second transmission gate 40404 transmits the intermediate signal IS according to the rear latch enabling signal RLES0 and the inverse rear latch enabling signal IRLES0. The second latch unit 40406 has a first terminal coupled to the third terminal of the second transmission gate 40404 for latching the intermediate signal IS. The second latch unit 40406 includes an eighth inverter 404062 and a ninth inverter 404064. The eighth inverter 404062 has a first terminal coupled to the first terminal of the second latch unit 40406, and a second terminal. The ninth inverter 404064 has a first terminal coupled to the second terminal of the eighth inverter 404062, and a second terminal coupled to the first terminal of the second latch unit 40406. Therefore, the second latch unit 40406 can latch a voltage of the first terminal of the second latch unit 40406 at the intermediate signal IS by the eighth inverter 404062 and the ninth inverter 404064. The seventh inverter 40408 has a first terminal coupled to the third terminal of the second transmission gate 40404 for receiving the intermediate signal IS, and a second terminal for outputting a rear latch datum RLD0, where the seventh inverter 40408 is used for inverting the intermediate signal IS to generate the rear latch datum RLD0 to the bank B0, and a phase of the rear latch datum RLD0 is the same as the phase of the datum D. Further, subsequent structures and operational principles of the rear latch circuits 4041 to 404n–1 are the same as those of the rear latch circuit 4040, so further description thereof is omitted for simplicity.

Figure 5:
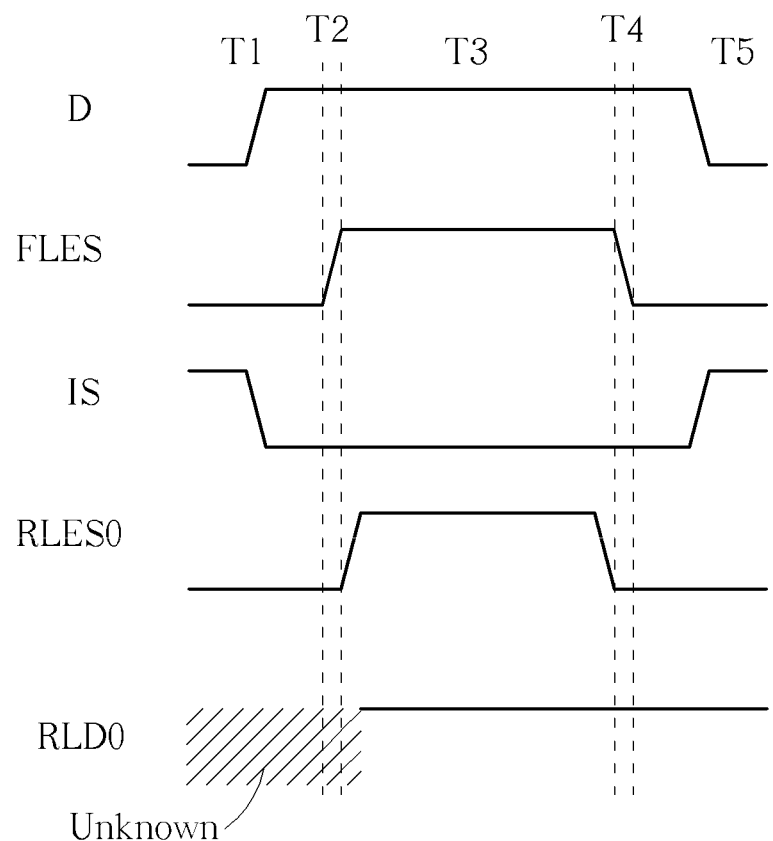
FIG. 5 is a timing diagram illustrating operation timings of the front latch circuit and the rear latch circuit of the latch system.

Please refer to FIG. 5. FIG. 5 is a timing diagram illustrating operation timings of the front latch circuit 402 and the rear latch circuit 4040 of the latch system 400. As shown in FIG. 5, at a first interval T1, the front latch enabling signal FLES and the rear latch enabling signal RLES0 are at a logical-low voltage "0", so the first transmission gate 4026 is turned on, and the second transmission gate 40404 is turned off. Meanwhile, the first transmission gate 4026 can transmit the datum D, so the intermediate signal IS is equal to the datum D and the rear latch datum RLD0 is unknown. At a second interval T2, the front latch enabling signal FLES is at a logical-high voltage "1" and the rear latch enabling signal RLES0 is at the logical-low voltage "0", so the first transmission gate 4026 and the second transmission gate 40404 are turned off. Therefore, at the second interval T2, the intermediate signal IS is equal to the datum D, and the rear latch datum RLD0 is still unknown. At a third interval T3, the front latch enabling signal FLES and the rear latch enabling signal RLES0 are at the logical-high voltage "1", so the first transmission gate 4026 is turned off and the second transmission gate 40404 is turned on. Meanwhile, the intermediate signal IS maintains a value of the intermediate signal IS at the second interval T2, and the rear latch datum RLD0 is equal to the intermediate signal IS. At a fourth interval T4, the front latch enabling signal FLES is at the logical-high voltage "1" and the rear latch enabling signal RLES0 is at the logical-low voltage "0", so the first transmission gate 4026 and the second transmission gate 40404 are turned off. Meanwhile, the intermediate signal IS still maintains the value of the intermediate signal IS at the second interval T2 and the rear latch datum RLD0 maintains a value of the rear latch datum RLD0 at the second interval T3. At a fifth interval T5, the front latch enabling signal FLES and the rear latch enabling signal RLES0 are at the logical-low voltage "0", so the first transmission gate 4026 is turned on and the second transmission gate 40404 is turned off. Meanwhile, the intermediate signal IS is equal to the datum D and the rear latch datum RLD0 still maintains the value of the rear latch datum RLD0 at the second interval T3.

To sum up, in the latch system applied to the plurality of banks of the memory circuit, the first transmission gate is controlled by the front latch enabling signal and the second transmission gate is controlled by the rear latch enabling signal, so the first transmission gate and the second transmission gate are not turned on simultaneously. Therefore, compared to the prior art, a signal of an output terminal of the latch system is not unpredictable. In addition, the latch system only has one front latch circuit, so an area of the latch system is less than an area of a latch system provided by the prior art.

Those skilled in the art will readily observe that numerous modifications and alterations of the device and method may be made while retaining the teachings of the invention.

What is claimed is:

1. A latch system applied to a plurality of banks of a memory circuit, the latch system comprising:
    a front latch circuit having a first input terminal for receiving a datum, a second input terminal for receiving a front latch enabling signal, and an output terminal for outputting an intermediate signal, wherein the front latch circuit generates the intermediate signal according to the datum and the front latch enabling signal, the front latch circuit comprising:
        a first inverter having a first terminal coupled to the second input terminal of the front latch circuit, and a second terminal for outputting an inverse front latch enabling signal, wherein the first inverter is used for inverting the front latch enabling signal to generate the inverse front latch enabling signal;
        a second inverter having a first terminal coupled to the first input terminal of the front latch circuit, and a second terminal for outputting a first datum, wherein the second inverter is used for inverting the datum to generate the first datum, and a phase of the first datum is opposite to a phase of the datum;
        a first transmission gate having a first terminal coupled to the second terminal of the second inverter for receiving the first datum, a second terminal for receiving the front latch enabling signal, a third terminal for outputting the first datum, and a fourth terminal coupled to the second terminal of the first inverter for receiving the inverse front latch enabling signal;
        a first latch unit having a first terminal coupled to the third terminal of the first transmission gate for receiving the first datum, and a second terminal for outputting a second datum, wherein a phase of the second datum is the same as the phase of the datum; and
        a third inverter having a first terminal coupled to the second terminal of the first latch unit for receiving the second datum, and a second terminal coupled to the output terminal of the front latch circuit for outputting the intermediate signal, wherein the third inverter is used for inverting the second datum to generate the intermediate signal, and a phase of the intermediate signal is opposite to the phase of the datum; and
    a plurality of rear latch circuits, each rear latch circuit having a first input terminal coupled to the output terminal of the front latch circuit for receiving the intermediate signal, a second input terminal for receiving a corresponding rear latch enabling signal, and an output terminal for outputting a rear latch datum to a corresponding bank, wherein the rear latch circuit generates the rear latch datum according to the intermediate signal and the corresponding rear latch enabling signal;
    wherein number of the plurality of banks is equal to number of the plurality of rear latch circuits, and only one rear latch enabling signal is enabled at any time.

2. The latch system of claim 1, wherein the first latch unit comprises:
    a fourth inverter having a first terminal for receiving the first datum, and a second terminal for outputting the second datum, wherein the fourth inverter is used for inverting the first datum to generate the second datum; and
    a fifth inverter having a first terminal for receiving the second datum, and a second terminal for outputting the first datum, wherein the fifth inverter is used for inverting the second datum to generate the first datum.

3. The latch system of claim 1, wherein the rear latch circuit comprises:
    a sixth inverter having a first terminal coupled to the second input terminal of the rear latch circuit, and a second terminal for outputting an inverse corresponding rear latch enabling signal, wherein the sixth inverter is used for inverting the corresponding rear latch enabling signal to generate the inverse corresponding rear latch enabling signal;
    a second transmission gate having a first terminal coupled to the first input terminal of the rear latch circuit for receiving the intermediate signal, a second terminal coupled to the second input terminal of the rear latch circuit for receiving the corresponding rear latch enabling signal, a third terminal for outputting the intermediate signal, and a fourth terminal coupled to the second terminal of the sixth inverter for receiving the inverse corresponding rear latch enabling signal;
    a second latch unit having a first terminal coupled to the third terminal of the second transmission gate for latching the intermediate signal; and
    a seventh inverter having a first terminal coupled to the third terminal of the second transmission gate for receiving the intermediate signal, and a second terminal for outputting the rear latch datum, wherein the seventh inverter is used for inverting the intermediate signal to generate the rear latch datum, and a phase of the rear latch datum is the same as the phase of the datum.

4. The latch system of claim 3, wherein the second latch unit comprises:

an eighth inverter having a first terminal coupled to the third terminal of the second transmission gate, and a second terminal; and a ninth inverter having a first terminal coupled to the second terminal of the eighth inverter, and a second terminal coupled to the third terminal of the second transmission gate.

5. The latch system of claim 1, wherein the rear latch circuit comprises:

a sixth inverter having a first terminal coupled to the second input terminal of the rear latch circuit, and a second terminal for outputting an inverse corresponding rear latch enabling signal, wherein the sixth inverter is used for inverting the corresponding rear latch enabling signal to generate the inverse corresponding rear latch enabling signal;

a second transmission gate having a first terminal coupled to the first input terminal of the rear latch circuit for receiving the intermediate signal, a second terminal coupled to the second input terminal of the rear latch circuit for receiving the corresponding rear latch enabling signal, a third terminal for outputting the intermediate signal, and a fourth terminal coupled to the second terminal of the sixth inverter for receiving the inverse corresponding rear latch enabling signal;

a second latch unit having a first terminal coupled to the third terminal of the second transmission gate for latching the intermediate signal; and a seventh inverter having a first terminal coupled to the third terminal of the second transmission gate for receiving the intermediate signal, and a second terminal for outputting the rear latch datum, wherein the seventh inverter is used for inverting the intermediate signal to generate the rear latch datum, and a phase of the rear latch datum is the same as a phase of the datum.

6. The latch system of claim 5, wherein the second latch unit comprises:

an eighth inverter having a first terminal coupled to the third terminal of the second transmission gate, and a second terminal; and a ninth inverter having a first terminal coupled to the second terminal of the eighth inverter, and a second terminal coupled to the third terminal of the second transmission gate.

\* \* \* \* \*